United States Patent
Pan

(10) Patent No.: US 6,255,681 B1
(45) Date of Patent: Jul. 3, 2001

(54) CMOS SENSOR STRUCTURE AND MANUFACTURING METHOD THEREOF

(75) Inventor: Jui-Hsiang Pan, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/667,659

(22) Filed: Sep. 22, 2000

Related U.S. Application Data

(62) Division of application No. 09/138,966, filed on Aug. 24, 1998.

(30) Foreign Application Priority Data

Jun. 15, 1998 (TW) ................................................. 87109465

(51) Int. Cl.$^7$ ........................ H01L 31/062; H01L 31/113
(52) U.S. Cl. ........................................... 257/292; 257/436
(58) Field of Search ..................................... 257/292, 291, 257/369, 436, 914

(56) References Cited

U.S. PATENT DOCUMENTS 6,100,551 * 8/2000 Lee et al. ............................. 257/232
6,147,373 * 11/2000 Moon ................................... 257/233

* cited by examiner

*Primary Examiner*—Ngân V. Ngô

(57) ABSTRACT

A CMOS sensor structure and method of manufacture employs conventional semiconductor techniques. The CMOS sensor has a silicon nitride layer in the substrate formed by a high-energy implant technique. The silicon nitride layer is formed below the P-N junction created by a sensing region and the substrate. Utilizing the difference in refractive indexes between the silicon nitride layer, the substrate material (P-N junction area) and a passivation dielectric layer, the silicon nitride layer becomes an effective light-reflecting buffer layer. Hence, the effective interaction length of light ray is increased and the possibility of light absorption by the substrate is reduced.

6 Claims, 2 Drawing Sheets

CMOS SENSOR STRUCTURE AND MANUFACTURING METHOD THEREOF

CROSS-REFERENCE TO RELATED APPLICATION

This application is a divisional application of, and claims the priority benefit of, U.S. application Ser. No. 09/138,966 filed on Aug. 24, 1998.

BACKGROUND OF THE INVENTION

1. Field of Invention

The present invention relates to a complementary metal-oxide-semiconductor (CMOS) sensor structure and method of manufacture. More particularly, the present invention relates to a method of manufacturing a CMOS sensor having a silicon-on-insulator (SOI) substrate formed by a nitrogen implant.

2. Description of Related Art

A charge-coupled device (CCD) is a commonly used digital sensing device for extracting images. Applications of CCD are many and have been used in security systems, image recorders and video cameras. However, CCDs are generally expensive and difficult to miniaturize. Due to the current trend for miniaturization, low power consumption and low cost of production, a type of CMOS photo diode device has been recently developed. Employing the latest semiconductor manufacturing techniques to fabricate the CMOS photo diode device. cost of production is low. Moreover, the diode consumes very little energy and is very compact. At present, these CMOS photo diodes are used in PC cameras, digital cameras and some other photographic instruments.

A photo diode is a photosensitive semiconductor device (or light sensing device) that makes use of a P-N junction to convert photonic energy into electrical signals. Due to the presence of an electric field at the P-N junction, electrons in the N-type layer and holes in the P-type layer cannot diffuse across the junction in the absence of light. However, when light of sufficient energy is shone on the junction, molecules near the junction are be activated to generate electron-hole pairs. These electrons and holes then diffuse towards the junction.

In the presence of an internal electric field, the electrons move across the junction into the N-type region while the holes also move across the junction into the P-type region. Consequently, a current is able to flow through the P-N junction. Ideally, the photo diode is in an open-circuit state when surrounded by total darkness.

FIG. 1 is a cross-sectional view showing the structure of a conventional CMOS sensor. As shown in FIG. 1, the CMOS sensor has a P-type semiconductor substrate 100, a field oxide layer 104, a P-well 110, a gate structure 120, an N-type source/drain region 122, an N-type sensor region 124, a depletion region 126 and a borophosphosilicate glass/nitride-silicide glass dielectric protective layer 134.

Since the depletion region 126 is at the P-N junction, electron-hole pairs are generated when a beam of light 140 falls on this region. Hence, light energy is transformed to a current signal. However, the light beam 140 can activate the molecules in the depletion region 126 in a single pass so that its effective interaction length is rather short.

Consequently, only a very small current signal is generated leading to a low contrast ratio. In other words, sensitivity of the photo diode is small. Moreover, a portion of the light ray may penetrate through the depletion region 126 to reach the substrate region 100. When the light ray is absorbed by the substrate 100, undesirable current may be produced.

In light of the foregoing, there is a need to improve the CMOS sensor structure.

SUMMARY OF THE INVENTION

Accordingly, the present invention provides a CMOS sensor structure having a reflecting surface embedded in the substrate so that the effective interaction length of a light beam is increased.

Another aspect of this invention is to improve the contrast ratio for the CMOS sensor so that the sensor is more sensitive to light.

A third aspect of this invention is to reduce substrate leakage current produced by the CMOS sensor.

To achieve these and other advantages and in accordance with the purpose of the invention, as embodied and broadly described herein, the invention provides a method of manufacturing CMOS sensor. The method comprises the steps of forming a silicon nitride layer within a first conductive type substrate, and then forming a gate structure over the substrate.

Thereafter, a source/drain region of the second conductive type is formed in the substrate on one side of the gate structure, whereas a sensing region of the second conductive type is formed in the substrate on the other side of the gate structure. The sensing region is located above the silicon nitride layer. Finally, a dielectric protection layer is formed over the sensing region and the gate structure.

The sensor is fabricated using conventional semiconductor manufacturing techniques. A depletion region is formed at the junction between the sensing region and the substrate. Because the refractive index in the sensing region and the depletion region is larger than the silicon nitride layer, incident light coming from above is able to reflect portion of the light back at the silicon nitride/silicon substrate interface. Consequently, the effective interaction length for an incoming light ray is increased, and the probability of absorption by the substrate is reduced.

This invention also provides a CMOS sensor structure. The structure comprises a substrate of the first conductive type, a gate structure above the substrate, a source/drain region of the second conductive type and a sensing region of the second conductive type in the substrate, one on each side of the gate structure, a silicon nitride layer within the substrate below the sensing region, and a dielectric passivation layer over the gate structure and the sensing region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
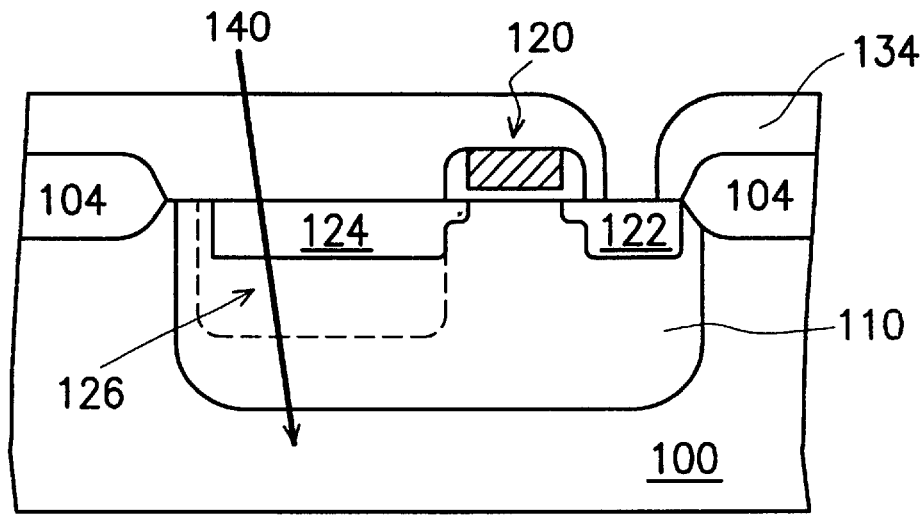
FIG. 1 is a cross-sectional view showing the structure of a conventional CMOS sensor.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in fabricating a CMOS sensor according to one preferred embodiment of this invention.

Figure 2A:
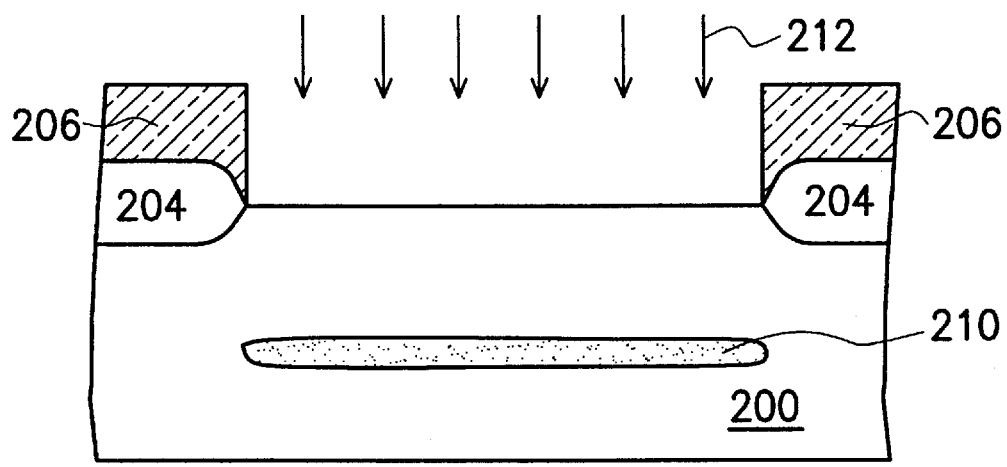
FIGS. 2A through 2E are cross-sectional views showing the progression of manufacturing steps in fabricating a CMOS sensor according to one preferred embodiment of this invention.

First, as shown in FIG. 2A, a device isolating structure is formed over a substrate 200, for example, a P-type substrate. The device isolating structure can be a field oxide (FOX) layer 204 or other design having similar function. Thereafter, a photoresist layer 206 is formed over the field oxide layer 204 preventing any effects on the field oxide layer 204 due to subsequent operations.

Thereafter, operations for forming a P-N junction photodiode inside the semiconductor substrate 200 are carried out. In general, for an N-well fabrication, forming an N+ diode in a P/P+ substrate produce a better result.

First, a P-well is formed inside a P-type semiconductor substrate 200, and then a patterned photoresist layer 206 is formed over the substrate 200. Next, using the photoresist layer 206 as a mask, P-type ions such as boron ($B^{11}$) are implanted to form a P-doped region 210 in the interior of the substrate 200. By adjusting the energy level and dosage used in the boron implant 212, depth of penetration of the boron ions and distribution of boron ions inside the substrate can be controlled In this embodiment, energy level used in the implantation of boron ions is about 180 KeV, and the concentration level of boron ions in the doped region 210 is about $7 \times 10^{12}$ ions/cm$^2$. After the ion implantation, the photoresist layer 206 is removed.

Figure 2B:
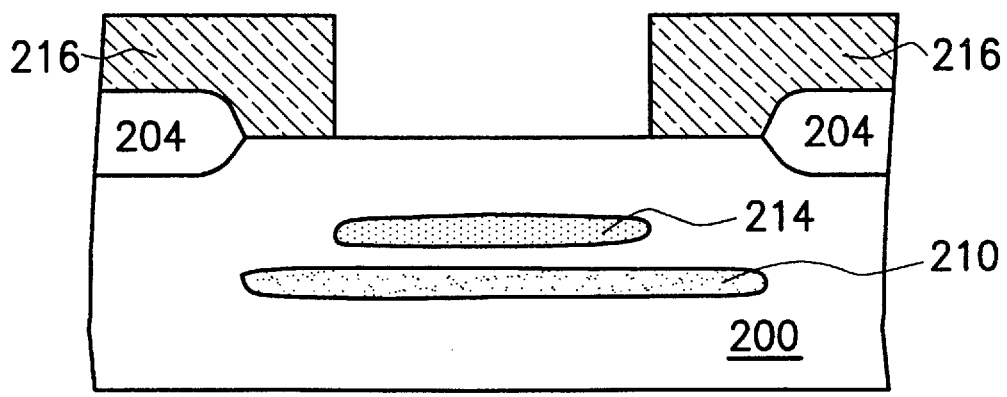

Next, fabrication of the silicon-on-insulator (SOI) is carried out as shown in FIG. 2B. An insulating layer, preferably a silicon nitride layer, is formed at a certain distance below the upper surface of the substrate. Details of the method can be found in J. Appl. Phys. 51 (12), pp 6169–6175, 1989 by Bourguet et al. The method of forming an insulating (silicon nitride layer) as a silicon-on-insulator structure is applied to the fabrication of a CMOS sensor. Since the method of forming the SOI structure is a major aspect of this invention, details are described below.

First, a photoresist layer 216 is formed over the semiconductor substrate 200. This photoresist layer 216 exposes the region where the silicon nitride layer of a SOI structure isto be formed. Using the photoresist layer 216 as a mask, nitrogen ions are doped to form a nitrogen-doped region 214 at a temperature of about 500° C. The energy level used to implant the nitrogen ions is about 180 KeV, and the concentration level is about $1 \times 10^{18}$ ions/cm$^2$. As soon as the nitrogen implantation is over, the photoresist layer 216 is removed.

Figure 2C:
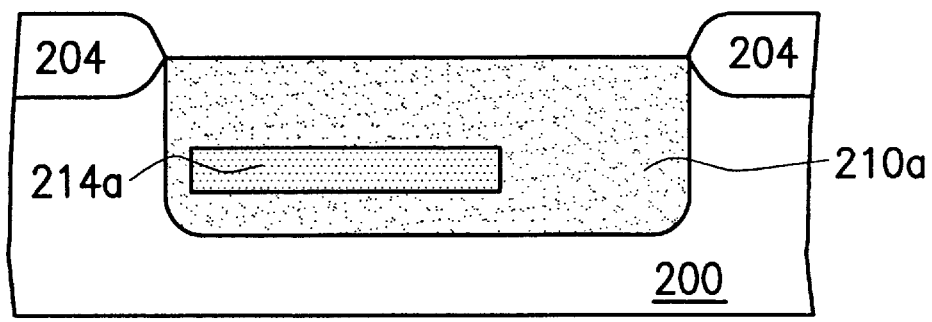

Thereafter, as shown in FIG. 2C, an annealing operation is carried out at a high temperature of about 2000° C. for about 2 hours. The annealing operation spreads out the nitrogen ions in the nitrogen-doped region 214. Moreover, the nitrogen react with the silicon in the substrate to form an electrically insulating silicon nitride layer 214a. In the meantime, the boron-doped region 210 turns into a P-well 210a having the silicon nitride layer 214a buried inside the P-well 210a. The refractive index of the silicon nitride layer 214a is about 2.05. The silicon nitride layer 204a inside the substrate 200 represents another major aspect of this invention. The silicon nitride layer 214a turns the substrate into a base-plate for a SOI structure. This SOI structure functions as a buffered reflective layer.

Figure 2D:
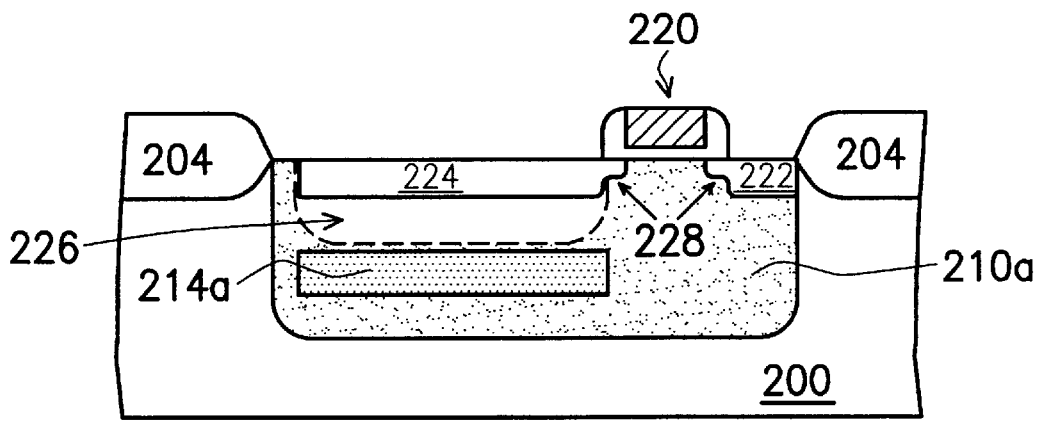

Next, as shown in FIG. 2D, conventional methods are used to form a gate structure 220 above the semiconductor substrate 200. Thereafter, N-type ions of low concentration are implanted into the substrate to form lightly doped drain structures 228. Then, spacers are formed on the sidewalls of the gate structure 220. Subsequently, using the gate structure 220 and the spacers as masks, N-type ions of high concentration are implanted into the substrate to form an N+source/drain region 222 and an N+sensing region 224. Hence, the source/drain region 222 and the sensing region 224 are formed in the same implantation.

However, the source/drain region 222 and the sensing region 224 can also be formed in two separate implantations depending on whether the same dosages are required in the source/drain region 222 and the sensing region 224 or not. A depletion region 226 is formed in the area between the N+sensing region 224 and the P-N junction surface of the P-well 210a. The refractive index in the depletion region 226 is larger than the subsequently formed passivation layer above and the silicon nitride layer 214a below.

Figure 2E:
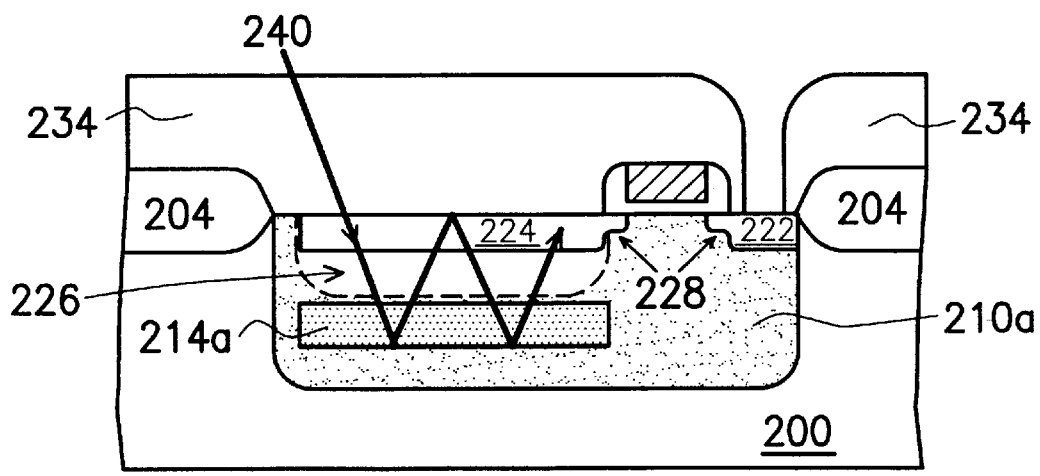

Next, as shown in FIG. 2E, a passivation dielectric layer 234 is formed over the entire substrate structure 200. Preferably, the passivation layer 234 is a borophosphosilicate glass/silicon nitride glass composite layer or some other material having similar properties. Thereafter, an anisotropic dry etching method is used to expose a region where a conductive wire leading to the source/drain region is required. The passivation layer 234 has a refractive index of about 1.46.

When light impinges on the depletion region 226, electron-hole pairs are generated thus producing an electric current. Hence, the semiconductor device is capable of transforming light energy into electrical signals. Since the refractive indexes of the depletion region 226 and the substrate 200 are larger than the silicon nitride layer 214a, a light beam 240 is reflected from the silicon nitride layer 214a. Consequently, the path taken by the light beam 240 is longer, and the effective interaction length of light increases. Therefore, electrical current flowing through the depletion region 226 is amplified.

In addition, because the light beam 240 can hardly penetrate through the silicon nitride layer 214a, the probability of light absorption by the semiconductor substrate 200 is greatly reduced. Hence, substrate leakage problems can be avoided.

Since the silicon nitride layer is capable of reducing substrate leakage current, and the reflective buffer layer is capable of amplifying photoelectric signals, the so-called on/off ratio or the contrast ratio of the CMOS sensor is increased. In other words, sensitivity of the CMOS sensor is improved.

In summary, major aspects of this invention include:
1. By forming a reflective buffer layer below the depletion region in this CMOS sensor structure, the effective interaction length of incoming light rays is increased. Hence, incoming light rays are amplified into a larger electric current.
2. When the CMOS sensor of this invention is applied to an image extraction system, a larger contrast ratio and a higher sensitivity are obtained.
3. The CMOS sensor of this invention has a low substrate leakage current.

4. The CMOS sensor is fabricated using conventional methods and equipment, and hence can be easily incorporated into the production line of most manufacturers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A CMOS sensor structure, comprising:
   a substrate of a first conductive type;
   a gate structure above the substrate;
   a source/drain region of a second conductive type in the substrate on one side of the gate structure;
   a sensing region of a second conductive type in the substrate on the other side of the gate structure;
   a silicon nitride within the substrate below the sensing region; and
   a passivation dielectric layer over the gate structure and the sensing region.

2. The structure of claim 1, wherein the first conductive type is of the opposite polarity to the second conductive type.

3. The structure of claim 1, wherein the silicon nitride layer is formed by the steps of:
   performing an implantation using nitrogen at a temperature of about 500° C., wherein the implantation energy level is about 180 KeV and the implantation concentration is about $1 \times 10^{18}$ ions/cm$^2$; and
   performing an annealing operation at a high temperature of about 2000° C. for about 2 hours.

4. The structure of claim 1, wherein the passivation dielectric layer includes a borophosphosilicate glass/silicon nitride glass composite layer.

5. The structure of claim 1, wherein the sensing region and the substrate have refractive indexes larger than the passivation dielectric layer and the silicon nitride layer.

6. The structure of claim 1, wherein the sensing region further includes a reflective buffer layer formed underneath the sensing region for reflecting incoming light rays.

* * * * *